(12) United States Patent
Nguyen et al.

(10) Patent No.: US 7,492,607 B2
(45) Date of Patent: Feb. 17, 2009

(54) EJECTOR FACEPLATE FOR ELECTRONICS MODULE

(75) Inventors: Khanh Nguyen, Allen, TX (US); Gary Kirpatrick, Garland, TX (US)

(73) Assignee: Lineage Power Corporation, Mesquite, TX (US)

( * ) Notice: Subject to any disclaimer, the term of this patent is extended or adjusted under 35 U.S.C. 154(b) by 561 days.

(21) Appl. No.: 11/147,730

(22) Filed: Jun. 8, 2005

(65) Prior Publication Data

US 2006/0279183 A1   Dec. 14, 2006

(51) Int. Cl.
*H05K 7/12* (2006.01)
(52) U.S. Cl. ............... 361/798; 361/754; 361/759; 361/747; 361/801; 312/223.2
(58) Field of Classification Search ............. 361/798, 361/754, 796, 679, 726, 732, 740, 747, 759, 361/801; 312/223.2, 223.3
See application file for complete search history.

(56) References Cited

U.S. PATENT DOCUMENTS

| | | | |
|---|---|---|---|
| 5,818,696 A * | 10/1998 | Knoop | 361/730 |
| 5,828,546 A * | 10/1998 | Tirrell et al. | 361/685 |
| 6,320,749 B1 * | 11/2001 | Ayres et al. | 361/730 |
| 6,473,300 B1 * | 10/2002 | Youngquist et al. | 361/685 |
| 6,603,657 B2 * | 8/2003 | Tanzer et al. | 361/685 |
| 6,625,019 B1 * | 9/2003 | Steinman et al. | 361/695 |
| 6,683,793 B1 * | 1/2004 | Campbell et al. | 361/796 |
| 6,754,074 B2 * | 6/2004 | McClelland et al. | 361/690 |
| 6,762,934 B2 * | 7/2004 | Kitchen et al. | 361/685 |
| 6,912,132 B2 * | 6/2005 | Riddiford et al. | 361/727 |
| 6,972,961 B2 * | 12/2005 | Erskine | 361/727 |
| 7,012,808 B2 * | 3/2006 | Mayer | 361/725 |
| 7,218,526 B2 * | 5/2007 | Mayer | 361/725 |

\* cited by examiner

*Primary Examiner*—Ishwar (I. B.) Patel
*Assistant Examiner*—Dameon E Levi

(57) ABSTRACT

In one aspect, the present invention provides a latch/ejector face plate assembly for an end of an electronics chassis assembly. The face plate is pivotally couplable to a front end of an electronics chassis. The face plate has a latch/ejector that comprises a latching portion that is latchably engageable against a rear side of a latching/fulcrum flange of a electronics rack shelf when the face plate is in a closed position, and an ejector edge that is engageable against a front side of the latching/fulcrum flange when the face plate is in an open position, to thereby provide an ejection force of the electronics chassis.

14 Claims, 7 Drawing Sheets

EJECTOR FACEPLATE FOR ELECTRONICS MODULE

TECHNICAL FIELD OF THE INVENTION

The present invention is directed, in general, to an electronics chassis for a power distribution rack and, more specifically, to an ejector faceplate for an electronic chassis and a method of manufacture therefor.

BACKGROUND OF THE INVENTION

The myriad of cooperating electrical components available today has created a need for apparatus which can securely and effectively store these components in stacked relationship, not only so that the components can be electrically interconnected with one another, but so that they can be readily accessed and used. This is particularly true in power management situations in which a large number of densely packed individual components are typically used together in order to create a desired power management system.

As overall component and rack sizes have decreased, this has led manufacturers to standardize the width dimension of rack mounting systems that may house these components as much as possible. Such systems generally consist of some sort of frame structure that have shelves with individual bays mounted thereon and into which smaller electronics chassis, such as power modules, rectifiers, or controllers can be inserted. These rack mounting systems are extant both in the form of rather large open systems permanently installed in establishments, and in the form of relatively small boxes which fully enclose the shelves of components to protect same from damage due to the surroundings.

Over the course of many years, as well as many design iterations, the industry has attempted to optimize all aspects of the rack mounting systems, as well as the chassis that are housed within these rack mounting systems. However, as the miniaturization and densification of rack design has occurred, the clearance space between the chassis residing on one shelf and the overlying shelf has shrunk such that it has become difficult to easily remove the chassis from their respective bays, which is important for maintenance, repair or replacement.

The removal of the chassis from its bay can be difficult because the back end of the chassis typically has an electrical interface that has a fairly tight frictional fit with a corresponding back end electrical interface on the shelf in which the chassis is located. Due to the limited clearance between the chassis and the shelf, it is difficult for a technician to adequately grasp the chassis and exert enough force to disengage the corresponding electrical interfaces from each other.

To overcome this, the industry has tried various types of fasteners and ejector systems. However, these systems have not adequately addressed the problem from a cost/benefit standpoint because of their design complexity or cost of manufacture. Other problems with these designs include the ejectors ability to apply enough insertion and ejection force to blind mate multi-beam connectors. Additionally, these designs use more chassis volume than is desirable and the devices lack the ability to lock and latch units into the shelf in both a vertical and horizontal direction.

Accordingly, what is needed in the art is an ejector design for use in a chassis that is simplistic in design, cost effective to manufacture, integrates into the shelf design with minimal change to the chassis or shelf and provides the required amount of latching and ejection force with respect to the chassis.

SUMMARY OF THE INVENTION

To address the above-discussed deficiencies of the prior art, the present invention provides an electronics chassis assembly for use in a components rack. In one embodiment, the electronic chassis assembly comprises a shelf having a sidewall with a latching/fulcrum flange that is located adjacent a front end of the shelf. Also included is a chassis that is positionable on the shelf and has a face plate that is pivotally coupled to a front end of the chassis. The face plate has a latch/ejector that comprises a latching portion that is latchably engageable against a rear side of the latching/fulcrum flange when the chassis is positioned on the shelf and the face plate is in a closed position, and an ejector edge engageable against a front side of the latching/fulcrum flange when the chassis is positioned on the shelf and the face plate is in an open position, to thereby provide an ejection force.

In another embodiment, there is provided a method of manufacturing an electronics chassis assembly for use in a component rack. This embodiment comprises forming a shelf having a sidewall with a latching/fulcrum flange located adjacent a front end of the shelf, and constructing an electronics chassis configured to house electrical components therein. Constructing the electronics chassis further comprises pivotally coupling a face plate to a front end of the electronics chassis. The face plate has a latch/ejector that comprises a latching portion that is latchably engageable against a rear side of the latching/fulcrum flange when the electronics chassis is positioned on the shelf and the face plate is in a closed position, and an ejector edge that is engageable against a front side of the latching/fulcrum flange when the electronics chassis is positioned on the shelf and the face plate is in an open position, to thereby provide an ejection force.

The present invention, in another embodiment, provides a latch/ejector face plate assembly for an end of an electronics chassis assembly. This embodiment comprises a face plate that is pivotally couplable to a front end of an electronics chassis. The face plate has a latch/ejector that comprises a latching portion that is latchably engageable against a rear side of a latching/fulcrum flange of an electronics rack shelf when the face plate is in a closed position, and an ejector edge that is engageable against a front side of the latching/fulcrum flange when the face plate is in an open position, to thereby provide an ejection force.

In yet another embodiment, the present invention provides A rack of components. This embodiment comprises a component rack, a plurality of support mechanisms coupled to the component rack at vertically spaced positions. Each support mechanism comprises a shelf having sidewalls that form a bay configured to house an electronics chassis, wherein at least one of the sidewalls includes a latching/fulcrum flange located at an insertion end of the bay. The electronics chassis is positioned within the bay and has a face plate pivotally coupled to a front end of the chassis. The face plate has a latch/ejector that comprises a latching portion that is latchably engageable against a rear side of the latching/fulcrum flange when the face plate is in a closed position, and an ejector edge that is engageable against a front side of the latching/fulcrum flange when the face plate is in an open position to thereby provide an ejection force.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
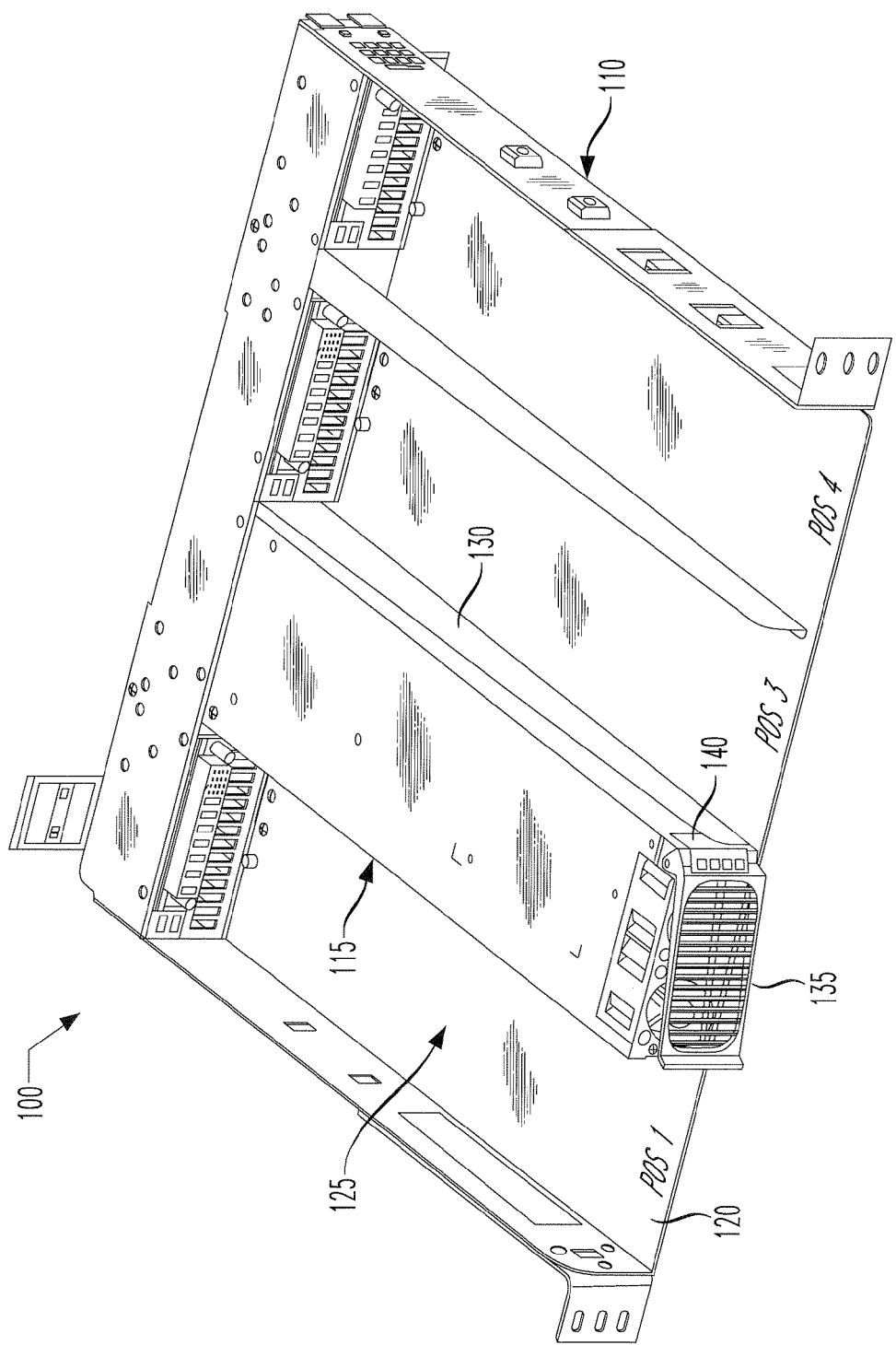
FIG. 1 illustrates a perspective view of an embodiment of an electronics chassis assembly provided by the present invention.

Referring initially to FIG. 1, illustrated is a perspective view of an electronics chassis assembly 100. The electronics assembly 100 can be of various types of construction and design. For example, in one application, the electronics chassis assembly 100 is configured as a power distribution module that can be inserted into a rack containing assemblies similar to the electronics assembly 100. In the illustrated embodiment, the electronics chassis assembly 100 comprises a shelf 110 and a chassis 115, such as an electronics chassis. The shelf 110 includes a base support shelf 120 that can be subdivided into a plurality of bays 125 by sidewalls 130. The sidewalls 130 are appropriately spaced to accommodate the width of the chassis 115 as is shown. The shelf can be constructed from conventional materials, such as metal or hard plastics.

Similarly, the shelf 120 has a depth that is sufficient to accommodate the length of the chassis 115. Located on the front of the chassis 115 is a face plate 135 that is shown in a partial open position. The face plate 135 is pivotally coupled to the chassis 115. In an exemplary embodiment, which is explained below in more detail, the face plate 135 cooperatively engages one of the adjacent sidewalls to provide a latch/ejector function; that is, the face plate 135 functions has both a latch and an ejector for the chassis 115. A light emitting diode (LED) cover 140, which is also discussed in more detail below, is also shown adjacent the face plate 135. In one embodiment, the face place 135 and the LED cover 140 form an assembly unit that is attached to the chassis 115. In such embodiments, the LED cover 140 to which the face plate 135 is pivotally attached is attached to the chassis 115 with fasteners, such as screws. However, in other embodiments, the face plate 135 and the LED cover 140 may constitute separate units that are separately attached to the chassis; that is, the LED cover 140 may be first attached to the chassis 115 and then the face plate 135 may be pivotally attached either to the chassis 115 itself, or it may be pivotally attached to the chassis 115 through the LED cover 140 by a hinge pin.

The face plate 135 is located at the front end of the shelf 110 and the chassis 115 extends to the back end of the shelf. The chassis 115 also includes a conventional electrical interface that is not shown that mates with a corresponding electrical interface located at the back end of the shelf 110, which is also not shown. The corresponding connectors form a high friction multi-beam connector. Due to the tight fit between the connectors, disengagement of the connectors requires that a substantial force be applied.

Figure 2:
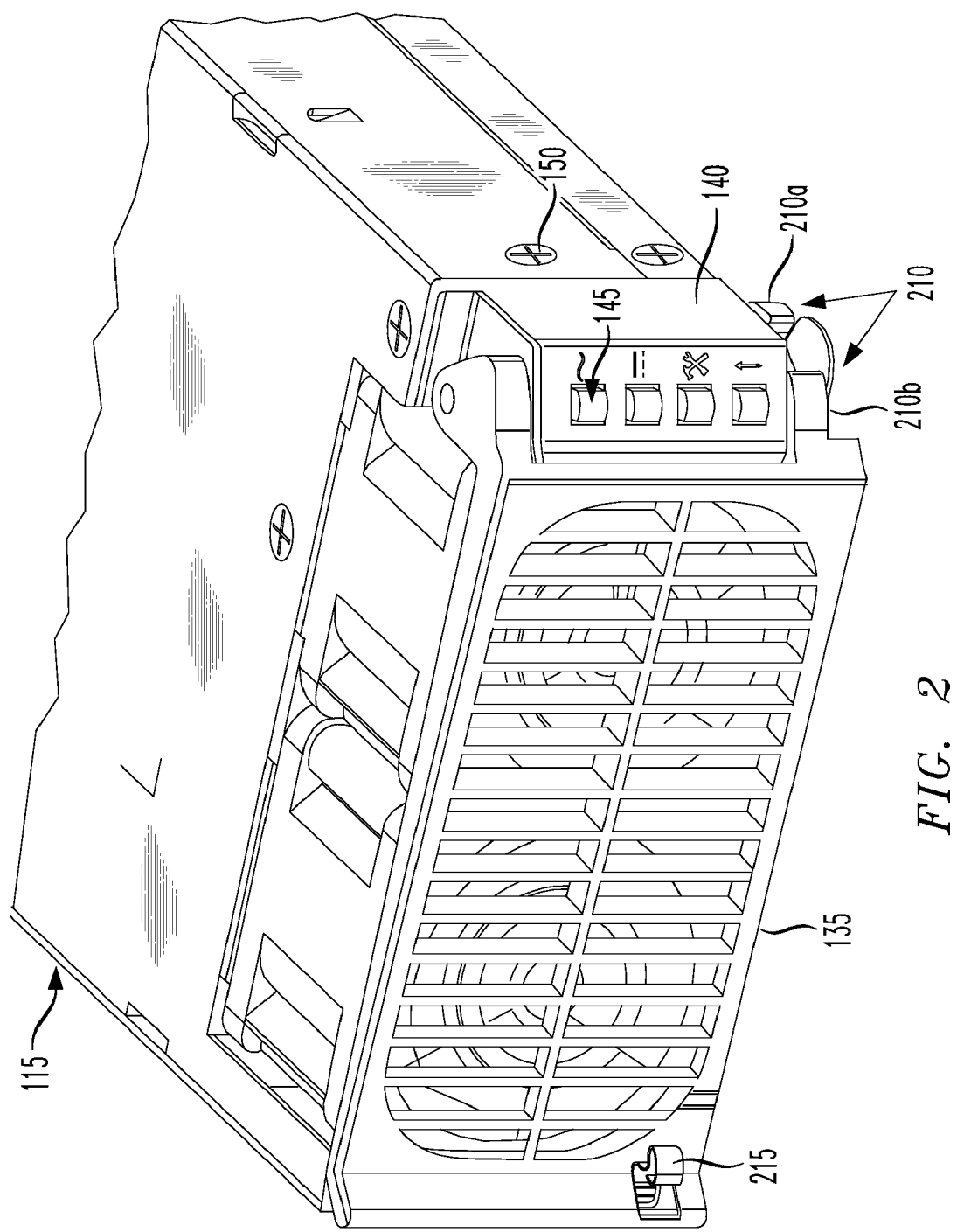
FIG. 2 illustrates an enlarged, front end perspective view of the support chassis of FIG. 1.

Turning now to FIG. 2, illustrated is an enlarged, front end perspective view of the support chassis 115 discussed above. As seen from this enlarged view, the face plate 135 is pivotally attached to the chassis 115 through the LED cover 140, which has openings therein and provides a cover for LEDs 145 and is secured to the chassis 115 by fasteners 150, such as screws. As seen in this embodiment, the face plate 135 is louvered to provide air flow therethrough, but it should be noted that in other embodiments, the face plate 135 may be a solid cover. In those applications where the face plate 135 is serving as a cover for cooling fans, it is particularly advantageous that the face plate 135 be louvered as shown in the illustrated embodiment. The face plate 135 may be constructed from any type of durable and hard material, such as metal or hard plastic, and given the teachings herein, one who is skilled in the art would understand how to construct the face plate 135 and the LED cover 140, either has separate units or as a single unit.

The face plate 135 includes a latch/ejector 210 that comprises a latching portion 210a and an ejector edge 210b. In one embodiment, the latch/ejector 210 is located on a bottom edge of the face plate 135 as illustrated. However, the latch/ejector 210 could be located elsewhere on the face place 135; for example, it could be located on the upper edge of the face plate 135. Further, the latching portion 210a and the ejector edge 210b need not be on the same edge. For example, in certain configurations, the latching portion 210a could be located on the bottom of the face plate 135, while the ejector edge 210b could be located on the top of the face plate 135 or the other way around. The latching portion 210a preferably has an arcuate shape, and in a more advantageous embodiment, the latching portion 210a is hooked-shaped, a portion of which is shown here, but is more clearly shown in the following figures that are discussed below. The ejector edge 210b preferably has a beveled shape, although its shape is not necessarily limited to this geometric configuration either. In construction, the present invention contemplates that the latch/ejector 210 may integrally formed with the face plate 135, or it may be formed separately and attached to the face plate 135.

The face plate 135 also preferably includes a face plate cover latch 215 located on a side of the face opposite the side on which the latch/ejector 210 is located. The face plate cover latch 215 may be of conventional design, such as the one shown, that retains the face plate 135 in a closed position. Also, the face plate 135 may be designed to have a slight bow or curve in its profile to minimize frontal protrusion.

Figure 3:
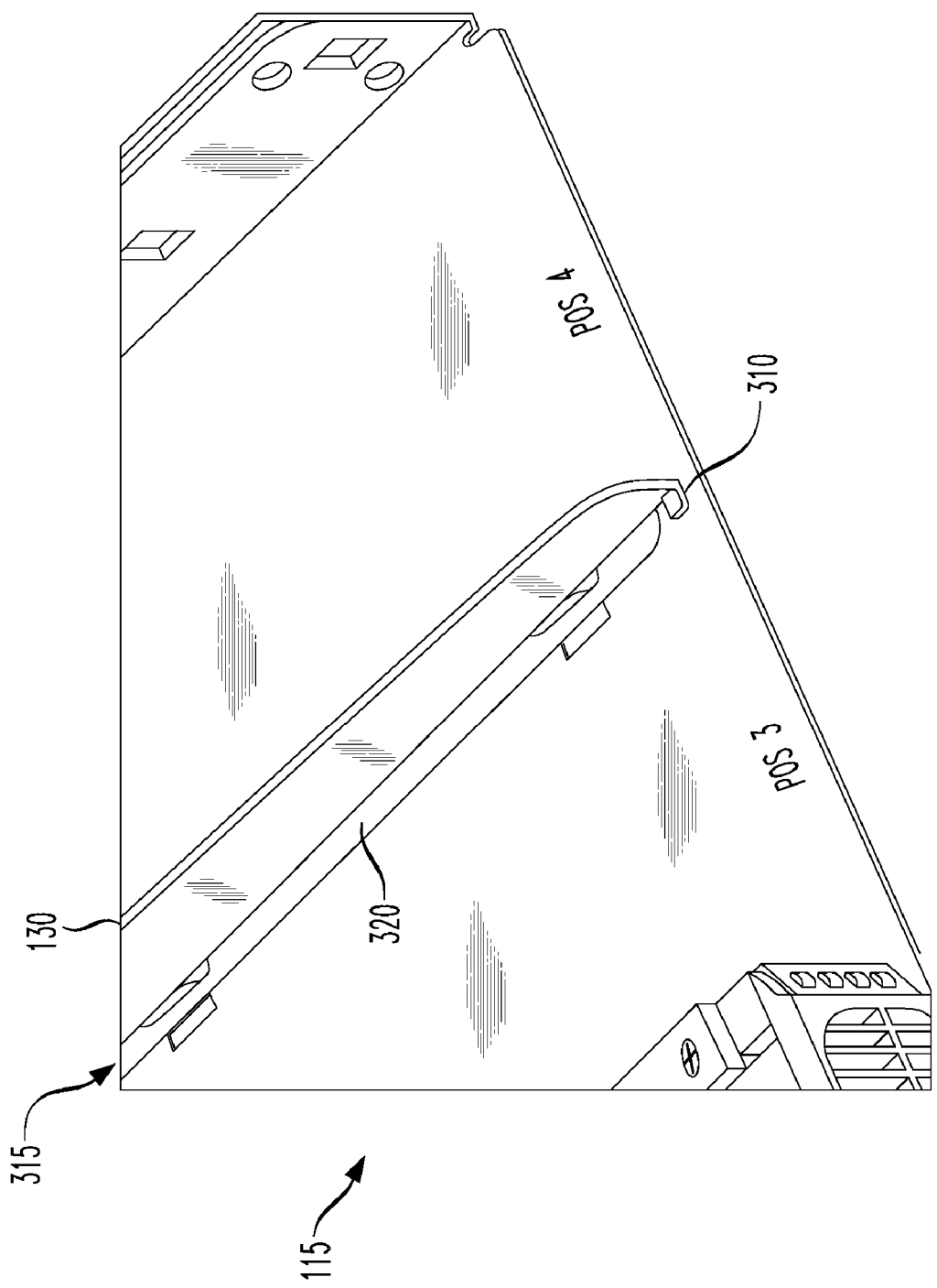
FIG. 3 illustrates an enlarged, partial perspective view of the shelf shown in FIG. 1.

Turning now to FIG. 3 with continued reference to FIG. 2, there is illustrated an enlarged, partial perspective view of the shelf 110 previously introduced in FIG. 1. The side wall 130 of the shelf 110 includes a latching/fulcrum flange 310 located adjacent a front end of the shelf 110. As explained below in more detail, the latching/fulcrum flange 310 cooperates with the latch/ejector 210 of the faceplate 135 to provide a latching force and an ejector force of the chassis 115 with respect to the shelf 110. While the latching/fulcrum flange 310 is shown at the bottom of the sidewall 130, in other embodiments, the latching/fulcrum flange 310 may be located at the top of the sidewall 130. In exemplary embodiments, the shelf 110 also includes a guide rail 315 that extends along and adjacent the sidewall 130. In advantageous embodiments, the guide rail is a bottom attachment flange 320 for the sidewall 130 and is integrally formed with the sidewall 130, as shown. The guide rail will typically extend to the back end of the shelf 110, but will terminate just short of the front end of the shelf 110, as shown. The latching/fulcrum flange 310 can be formed using conventional sheet metal manufacturing processes, such as notching the metal and bending the end up to form the latching/fulcrum flange 310 or molding hard plastic to the desired configuration. The clearance between the bottom of the shelf 110 and the latching/fulcrum flange 310 also provides beneficial cooperation with a tab on the chassis 115 to help further secure the chassis within the bay of the shelf 110, as is discussed below.

Figure 4:
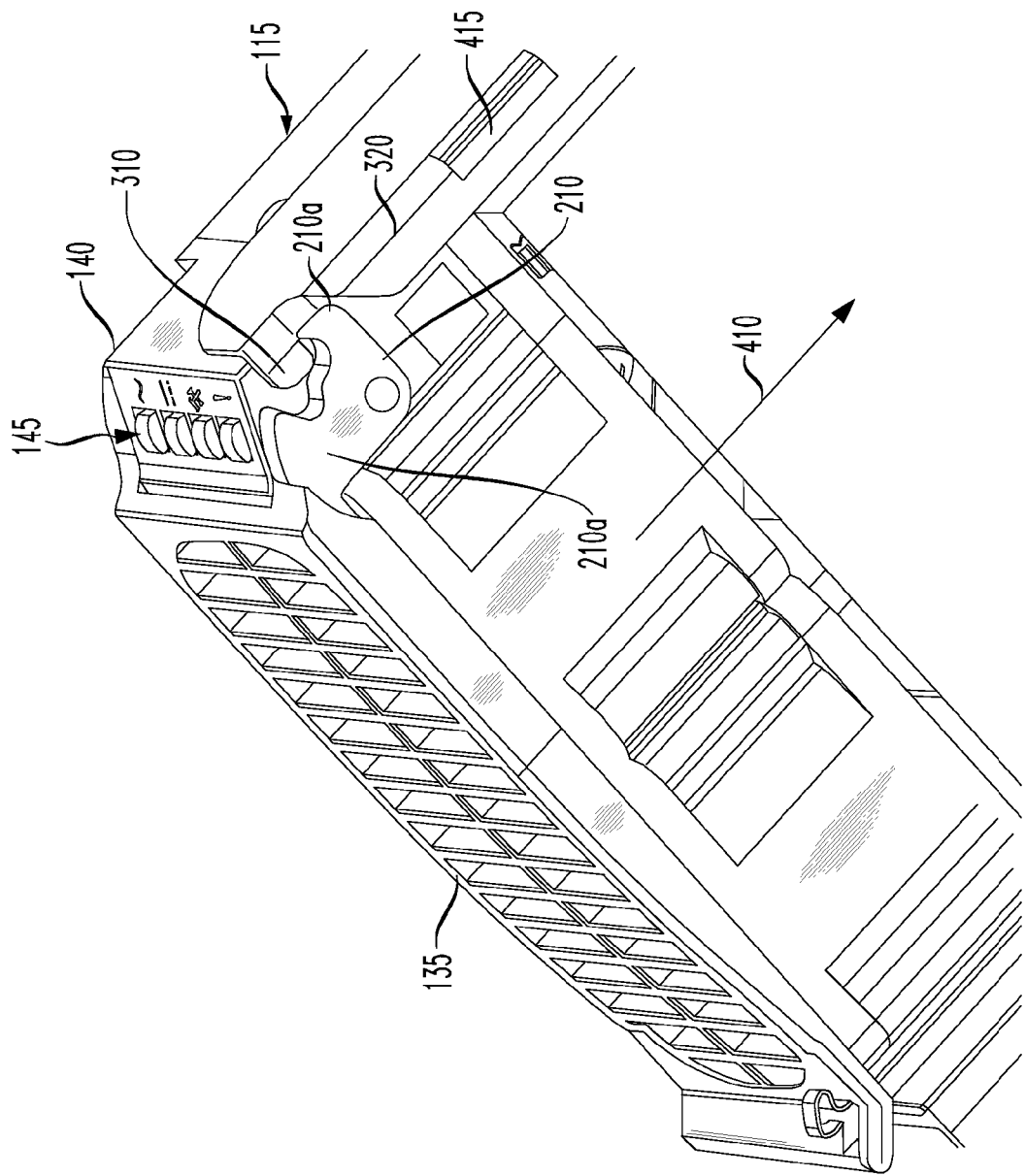
FIG. 4 illustrates an enlarged, partial perspective bottom view of the chassis with the face plate pivotally attached to it through the LED cover and further illustrating the cooperative engagement between the latch/ejector and the latching/fulcrum flange and the chassis and the guide rail.

Turning briefly now to FIG. 4, there is illustrated an enlarged, partial perspective bottom view of the chassis 115 with the face plate 135 pivotally attached to it through the LED cover 140 and illustrating the cooperative engagement between the latch/ejector 210 and the latching/fulcrum flange 310 and the chassis 115 and the guide rail 320. As shown in this particular view, the latching portion 210a is engaged against the back side of the latching/fulcrum flange 310. Thus, the latching portion 210a is designed to engage a rear side of a latching/fulcrum flange 310 when the chassis 115 is positioned on the shelf and the face plate 135 is in a closed position and exert an insertion force sufficient to cause the corresponding connectors to sufficiently engage and seat and retain the chassis in position. The engagement of the latching portion 210a with the latching/fulcrum flange 310 exerts an insertion and restraining force 410 of the chassis 115 against the back end of the shelf 110, as indicated by the arrow.

Also shown in FIG. 4 is a partial cut-away-view showing a side portion of the chassis 115 that illustrates a slot 415, such as an inverted "L" shaped slot, located in a bottom edge of the chassis 115 that extends along a length of the chassis 115/ The slot 415 is designed to minimize chassis volume, accommodate the guide rail 320, and provide clearance between the bottom of the chassis 115 and the guide rail 320 such that a bottom side of the chassis 115 can rest directly on the shelf 110.

Figure 5:
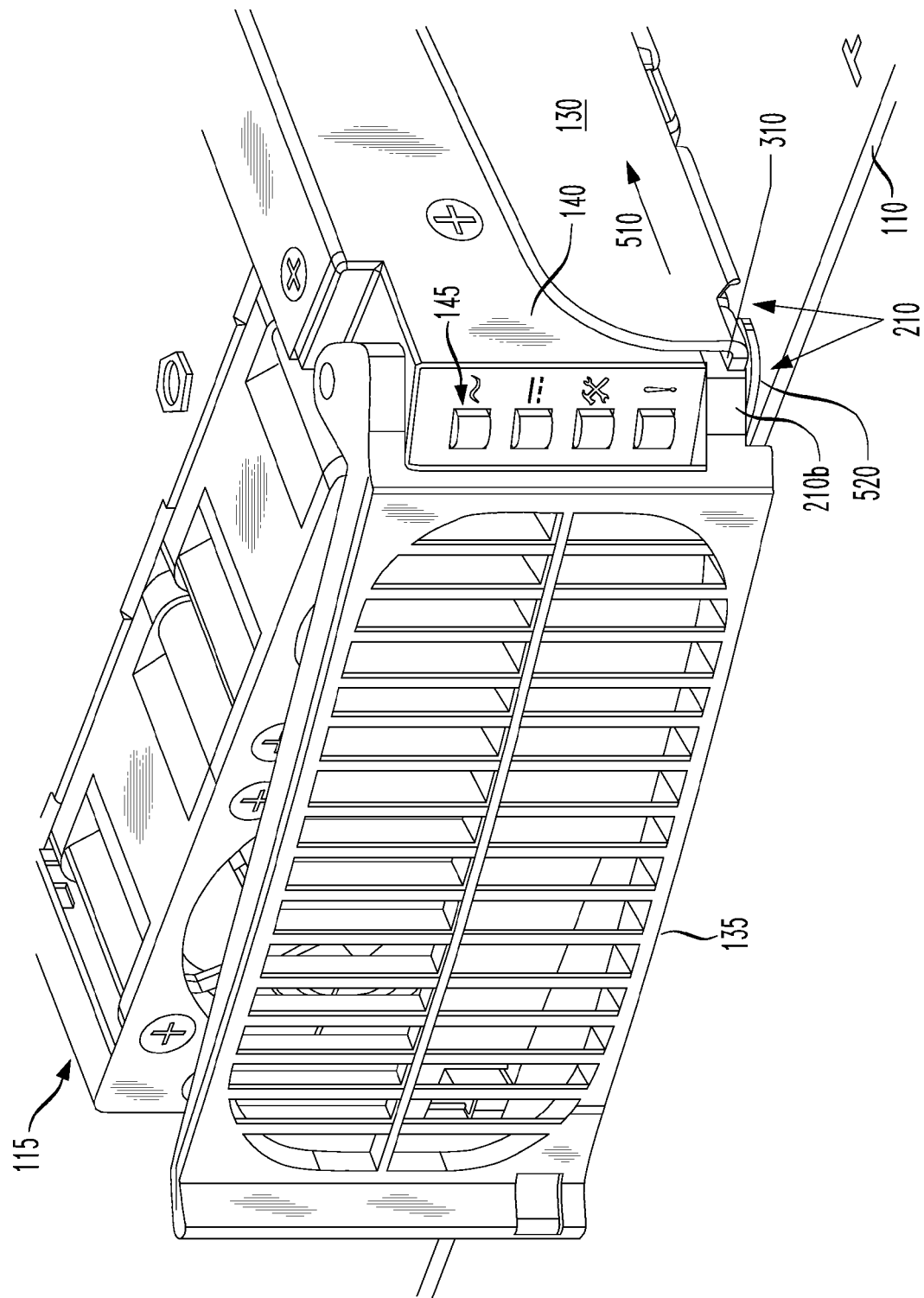
FIG. 5 illustrates an enlarged, partial perspective view of the chassis with the face plate in a partial open position.

Referring now to FIG. 5, there is illustrated an enlarged, partial perspective view of the chassis 115 with the face plate 135 in a partial open position. In this position, the latching portion 210a has disengaged the back side of the latching fulcrum flange 310, which allows for forward movement of the chassis 115, and the ejector edge 210b of the latch/ejector 210 is beginning to engage the front side of the latching/fulcrum flange 310. In the illustrated exemplary embodiment, the face plate 135 is open at about a 10 degree angle with respect to the chassis 115, which causes the respective mating electrical connectors of the chassis 115 and the shelf 110 to be a nominal 0.015 inches apart. In such a position, the ejection force 510 is not sufficient to fully disconnect the previously mentioned electrical connector (not shown) of the chassis 115 form the electrical mating connector (not shown) located at the back of the shelf 110. It should be understood, however, that the configuration of the ejector edge 210b could be designed to provide different forces when the face plate 135 is open at different degrees and that such designs, when given the teachings herein, are well within the skill of the art. For example, in one embodiment, the ejector edge 210b may be configured such that when the face plate 135 is open to an angle of 47 degrees with respect to the chassis 115, the respective mating connectors of the chassis 115 and the shelf 110 are about 0.30 inches apart, and when the face plate 135 is open to an angle of about 67 degrees, the respective mating connectors are fully disengaged and about 0.40 inches apart.

Also shown in FIG. 5 is the cooperation of a tab 520 that form a part of the chassis 115 with the latching/fulcrum flange 310. When the chassis 115 is positioned within a bay of the shelf 110, the tab 520 slips under the latching/fulcrum flange 310 and helps to prevent or reduce vertical movement of the chassis 115. This, along with the latching portion 210a, helps to securely hold the chassis 115 in position.

Figure 6:
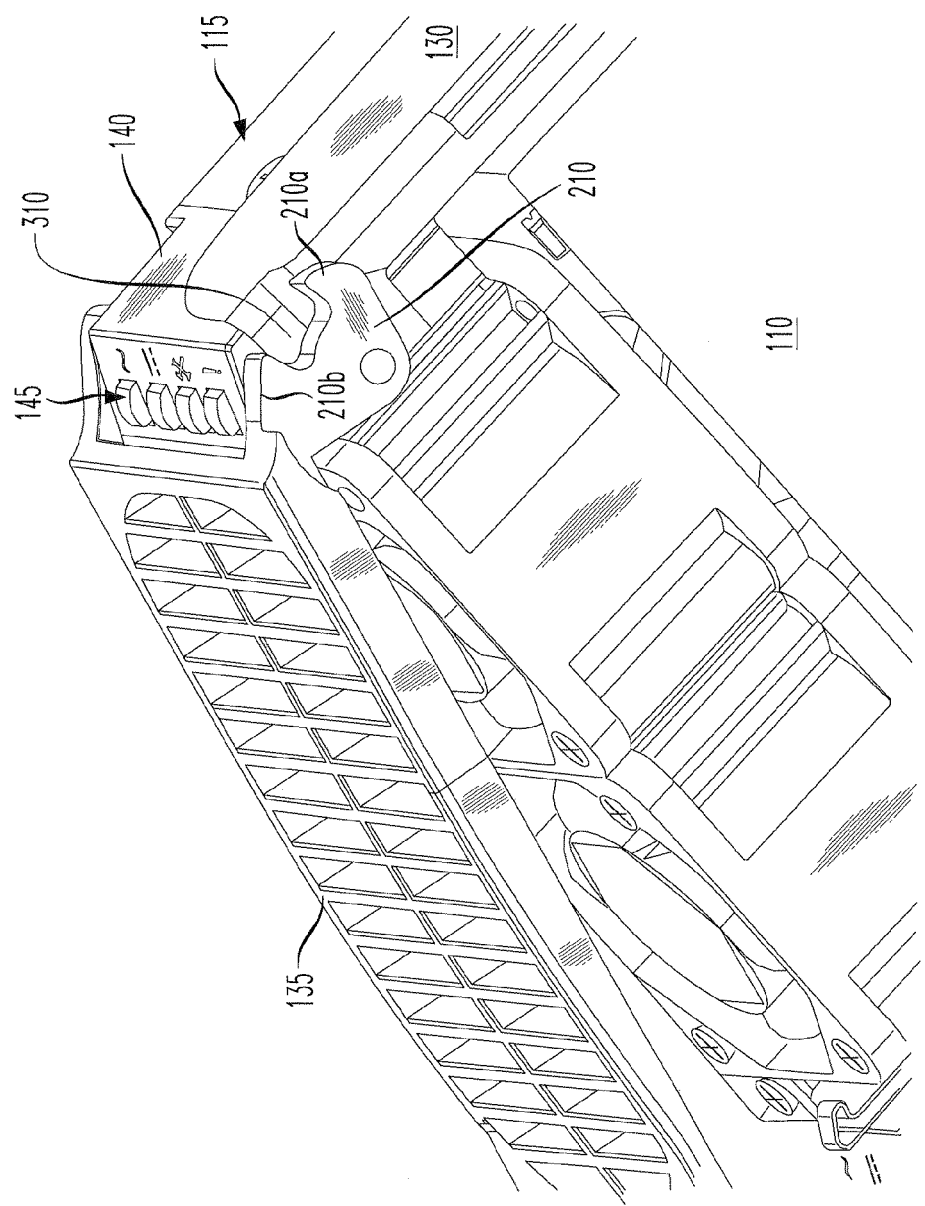
FIG. 6 illustrates a bottom view of FIG. 5 more clearly illustrating the clearance of the latching portion from the back side of the latching/fulcrum flange and engagement of the ejector portion with the front side of the latching/fulcrum flange.

FIG. 6 is a bottom view of FIG. 5 more clearly illustrating the clearance of the latching portion 210a from the back side of the latching/fulcrum flange 310 and engagement of the ejector portion 210b with the front side of the latching/fulcrum flange 310.

Figure 7:
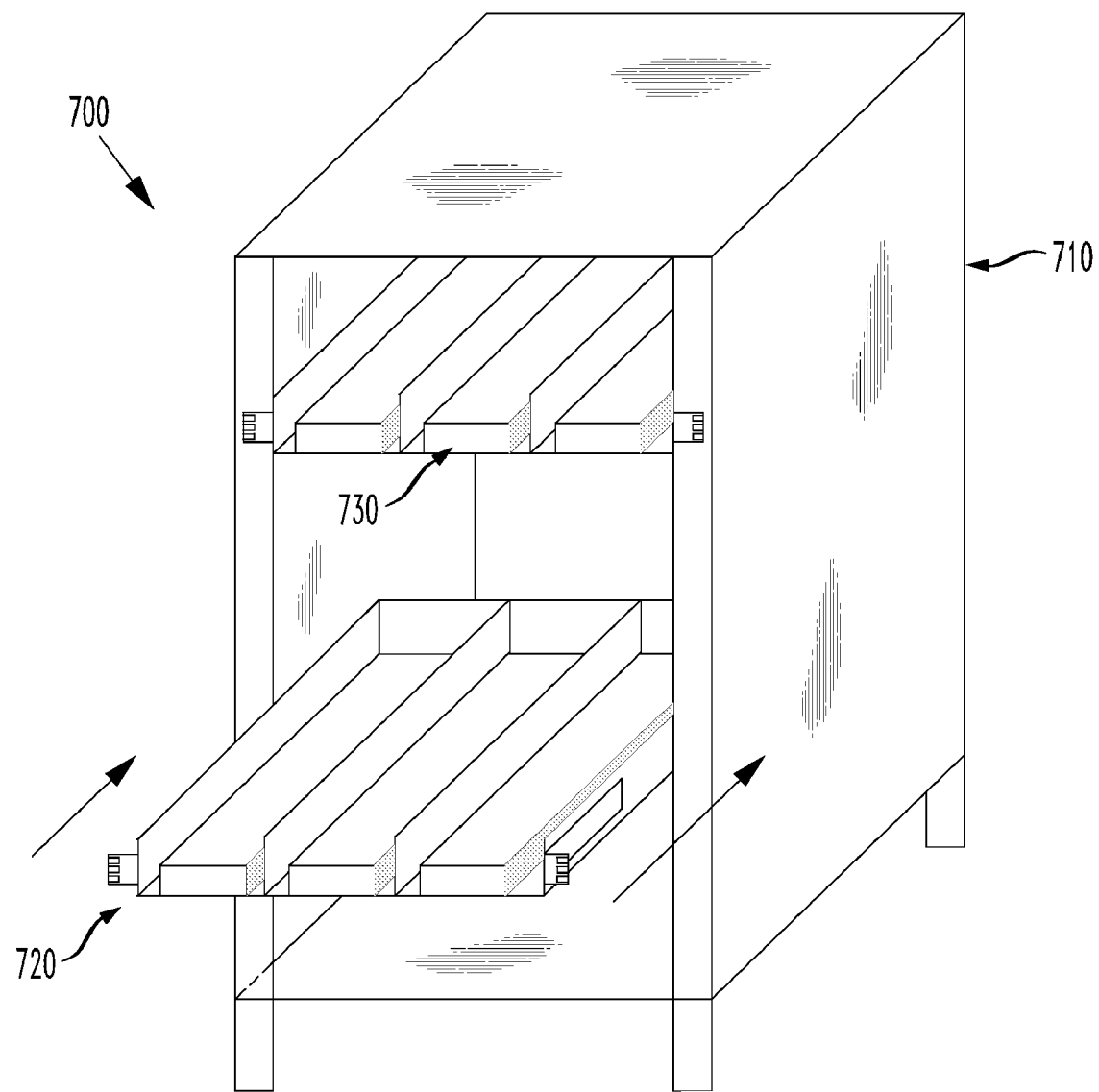
FIG. 7 illustrates a plan view of a rack of components manufactured and assembled in accordance with the principles of the present invention.

Turning finally to FIG. 7, illustrated is a plan view of a rack of components 700 incorporating the chassis and face plate as provided by the present invention. The rack of components 700 is of conventional design and construction and initially includes a component rack 710. The component rack 710 may comprise a number of different component racks while staying within the scope of the present invention. Nevertheless, in the embodiment of FIG. 7 the component rack 710 comprises a 19" wide rack capable of containing many support mechanisms 720.

As is illustrated, the support mechanisms 720 are coupled to the component rack 710 at vertically spaced positions. Additionally located within the support mechanisms 720 are one or more electronics chassis 730, as discussed above. In an exemplary embodiment, the one or more conventional components 730 are chosen from the group consisting of rectifiers, converters, ringers, distributions, controllers, fans, baffles, trays, or combinations thereof It goes without saying, however, that the present invention should not be limited to any specific component 730.

Although the present invention has been described in detail, those skilled in the art should understand that they can make various changes, substitutions and alterations herein without departing from the spirit and scope of the invention in its broadest form.

What is claimed is:

1. An electronics chassis assembly for use in a components rack, comprising:
    a shelf, including:
        a sidewall oriented perpendicular to the shelf, the sidewall having latching/fulcrum flange that serves as a sidewall lock tab positioned at a front end of the sidewall, the sidewall lock tab having an arcuate configuration; and
        a guide rail extending along and adjacent the sidewall; and
    a chassis positionable on the shelf and having a face plate pivotally coupled to a front end of the chassis, the face plate having a latch/ejector with a latching portion having an arcuate indentation in which the sidewall lock tab is cooperatively engageable thereto such that the latch ejector is latchably engageable against a rear side of the sidewall lock tab when the chassis is positioned on the shelf and the face plate is in a closed position, and an ejector edge of the latch/ejector is engageable against a front side of the sidewall lock tab when the chassis is positioned on the shelf and the face plate is in an open position to thereby provide an ejection force.

2. The electronics chassis as recited in claim 1 further comprising a light emitting diode (LED) cover attached to the front end of the chassis adjacent the latch/ejector, the face plate being pivotally mounted to the chassis through the LED cover.

3. The electronics chassis as recited in claim 2 wherein the face plate and the LED cover form an assembly unit.

4. The electronics chassis as recited in claim 1 wherein the latching portion is hooked-shaped.

5. The electronics chassis as recited in claim 1 wherein the ejector edge is beveled.

6. The electronics chassis as recited in claim 1 wherein the latch/ejector is located at a bottom edge of the face plate.

7. The electronics chassis as recited in claim 1 wherein the guide rail is a bottom attachment flange for the sidewall and the chassis further includes a slot located in a bottom edge of the chassis that extends along a length of the chassis and is configured to accommodate the guide rail such that a bottom side of the chassis can rest upon the shelf.

8. The electronics chassis as recited in claim 1 wherein the face plate is louvered to allow an air flow therethrough.

9. A rack of components, comprising:
   a component rack;
   a plurality of support mechanisms coupled to the component rack at vertically spaced positions, each support mechanism comprising;
   a shelf, including:
   sidewalls oriented perpendicular to the shelf that form a bay configured to house an electronics chassis, wherein at least one of the sidewalls includes a latching/fulcrum flange that serves as a sidewall lock tab located at an insertion end of the bay, the sidewall lock tab having an arcuate configuration; and
   a guide rail extending along and adjacent at least one of the sidewalls; and
   the electronics chassis positioned within the bay and having a face plate pivotally coupled to a front end of the chassis, the face plate having a latch/ejector with a latching portion having an arcuate indention in which the sidewall lock tab is cooperatively engageable thereto such that the latch/ejector is latchably engageable against a rear side of the sidewall lock tab when the face plate is in a closed position, and an ejector edge of the latch/ejector is engageable against a front side of the sidewall lock tab when the face plate is in an open position to thereby provide an ejection force.

10. The rack of components as recited in claim 9 wherein the electronics chassis further comprises a light emitting diode (LED) cover attached to the front end of the chassis adjacent the latch/ejector, the face plate being pivotally coupled to the electronics chassis through the LED cover.

11. The rack of components as recited in claim 10 wherein the face plate and the LED cover form an assembly unit.

12. The rack of components as recited in claim 9 wherein the latching portion is hooked-shaped and the ejector edge is beveled.

13. The rack of components as recited in claim 9 wherein the guide rail is a bottom attachment flange for the at least one of the sidewalls and the electronics chassis further includes a slot located in a bottom edge of the electronics chassis that extends along a length of the electronics chassis and is configured to accommodate the guide rail such that a bottom side of the electronics chassis can rest upon the shelf.

14. The rack of components as recited in claim 9 wherein the electronics chassis is one or more chassis selected from the group of components consisting of:
   rectifiers;
   converters;
   ringers;
   distributions;
   controllers
   fans;
   baffles
   trays; and
   combinations thereof.

* * * * *

UNITED STATES PATENT AND TRADEMARK OFFICE
CERTIFICATE OF CORRECTION

PATENT NO. : 7,492,607 B2  
APPLICATION NO. : 11/147730  
DATED : February 17, 2009  
INVENTOR(S) : Khanh Nguyen et al.

It is certified that error appears in the above-identified patent and that said Letters Patent is hereby corrected as shown below:

Title Page

(75) Inventors: "Khanh Nguyen, Allen TX (US);
Gary Kirpatrick, Garland, TX (US)"

should read

--Khanh Nguyen, Allen TX (US);
Gary Kirkpatrick, Garland, TX (US)--

Signed and Sealed this

Thirty-first Day of March, 2009

JOHN DOLL  
*Acting Director of the United States Patent and Trademark Office*